(12) United States Patent
Kadota et al.

(10) Patent No.: US 6,600,391 B2
(45) Date of Patent: Jul. 29, 2003

(54) END SURFACE REFLECTION TYPE SURFACE ACOUSTIC WAVE APPARATUS UTILIZING WAVES WITH A LONGITUDINAL WAVE OR SHEAR VERTICAL WAVE MAIN COMPONENT

(75) Inventors: Michio Kadota, Kyoto (JP); Kenya Hashimoto, Funahashi (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/003,555

(22) Filed: Nov. 2, 2001

(65) Prior Publication Data

US 2002/0079989 A1 Jun. 27, 2002

(30) Foreign Application Priority Data

Nov. 2, 2000 (JP) .......................................... 2000-335557
Oct. 22, 2001 (JP) .......................................... 2001-323307

(51) Int. Cl.[7] ................................................. H03H 9/64
(52) U.S. Cl. ................. 333/193; 310/313 A; 310/313 B
(58) Field of Search ................................. 333/193–196, 333/133; 310/313 R, 313 B, 313 C, 313 D, 313 A

(56) References Cited

U.S. PATENT DOCUMENTS

| | | | | | |
|---|---|---|---|---|---|
| 5,432,392 A | * | 7/1995 | Kadota et al. | .......... | 310/313 A |
| 5,953,433 A | * | 9/1999 | Fujimoto et al. | .......... | 381/337 |
| 6,150,900 A | * | 11/2000 | Kadota et al. | .......... | 333/133 |
| 6,317,014 B1 | * | 11/2001 | Kadota | .......... | 333/133 |

FOREIGN PATENT DOCUMENTS

| | | | |
|---|---|---|---|
| EP | 0 762 643 A1 | * | 3/1997 |
| JP | 4-82315 | * | 3/1992 |
| JP | 9-294045 | * | 11/1997 |

* cited by examiner

*Primary Examiner*—Barbara Summons
(74) *Attorney, Agent, or Firm*—Keating & Bennett, LLP

(57) ABSTRACT

A surface acoustic wave apparatus that is an end surface reflection type surface acoustic wave apparatus includes at least one interdigital transducer provided on a main surface of a piezoelectric substrate, and end surfaces of the piezoelectric substrate are used as reflection end surfaces. The surface acoustic wave apparatus generates and utilizes a surface acoustic wave that has a longitudinal wave or a shear vertical wave as its main component. It is preferred that the shear horizontal wave component and the shear vertical wave component, other than the longitudinal wave component, each occupy no more than about 20% of the total energy strength of the entire excited surface acoustic wave. It is also preferred that the longitudinal wave component occupies about 70% or more of the total energy strength of the entire excited surface acoustic wave. By doing so it is possible to produce an end surface reflection type surface acoustic wave apparatus that can easily provide a desired bandwidth.

24 Claims, 12 Drawing Sheets

END SURFACE REFLECTION TYPE SURFACE ACOUSTIC WAVE APPARATUS UTILIZING WAVES WITH A LONGITUDINAL WAVE OR SHEAR VERTICAL WAVE MAIN COMPONENT

BACKGROUND OF THE INVENTION

1. Field of the Invention

The present invention relates to a surface acoustic wave apparatus for use as, for example, a resonator or band filter, and more particularly, the present invention relates to an end surface reflection type surface acoustic wave apparatus that utilizes reflection of a surface acoustic wave transmitted between two opposite end surfaces.

2. Description of the Related Art

Surface acoustic wave apparatuses have been widely used as resonators and resonating-type band filters. Now, a surface acoustic wave apparatus that uses a Rayleigh wave as a surface acoustic wave has a structure in which at least one interdigital transducer (hereinafter "IDT") is provided on a piezoelectric substrate, and reflectors are disposed at both sides, in a surface acoustic wave propagation direction, of the region where the IDT is provided. That is, the reflectors are needed to reflect the surface acoustic wave between the reflectors and form a standing wave. As a result, the dimensions of the surface acoustic wave apparatus need to be large.

In contrast to this, there is a known end surface reflection type surface acoustic wave apparatus that uses a Shear Horizontal type ("SH-type") surface acoustic wave. With an SH-type surface acoustic wave such as a BGS wave, etc., the reflectors can be omitted and the two opposite end surfaces of a piezoelectric substrate can be used as reflection end surfaces. Therefore the surface acoustic wave apparatus can be made compact.

Nevertheless, the acoustic velocity of an SH wave in a piezoelectric substrate is slow, so a surface acoustic wave apparatus that uses an SH wave has difficulty handling high frequencies. Also, the bandwidth of a surface acoustic wave filter depends on the electromechanical coupling coefficient k of the piezoelectric substrate, and utilizing an SH-type surface acoustic wave puts limits on the piezoelectric substrate material. Therefore it is not easy to obtain a desired bandwidth due to the restriction of the electromechanical coupling coefficient k.

BRIEF DESCRIPTION OF THE INVENTION

In order to overcome the problems described above, preferred embodiments of the present invention provide an end surface reflection type surface acoustic wave apparatus that eliminates the defects of prior art, easily handles high frequencies, and easily provides a desired bandwidth.

Prior to the present invention, it was believed that one could not make an end surface reflection type surface acoustic wave apparatus that used a surface acoustic wave other than an SH wave. In contrast to this, the present inventors discovered that an end surface reflection type surface acoustic wave apparatus can be made by using a wave having a longitudinal wave or an Shear Vertical ("SV") wave as the main component of the surface acoustic wave components and by reflecting such a wave between two opposite end surfaces of a surface acoustic wave substrate.

According to a first preferred embodiment of the present invention, an end surface reflection type surface acoustic wave apparatus includes a piezoelectric substrate having a pair of opposite main surfaces and a pair of opposite end surfaces that connect the pair of opposite main surfaces, and at least one interdigital transducer disposed on one main surface of the piezoelectric substrate, wherein a longitudinal wave surface acoustic wave is a main component of surface acoustic waves generated along the piezoelectric substrate.

A Rayleigh wave has two components including a longitudinal wave and an SV wave. These two components are always coupled and propagated. Therefore it was previously considered not possible to use a Rayleigh wave to make a surface acoustic wave apparatus that utilizes end surface reflection.

Nevertheless, with the present invention, a surface acoustic wave having a main component that is a longitudinal wave is reflected at the end surfaces of a substrate without causing mode conversion, as clearly shown in preferred embodiments described later, so it is possible to produce an end surface reflection type surface acoustic wave apparatus that utilizes a longitudinal wave. Moreover, the longitudinal wave has a faster acoustic velocity than an SH wave, so high frequencies can be handled easily. Also, since it is an end surface reflection type surface acoustic wave apparatus, reflectors are not necessary, so the apparatus can be very compact.

According to a preferred embodiment of the present invention, an SH wave component and an SV wave component, other than the longitudinal wave component, each occupy no more than approximately 20% when the energy strength of the entire excited surface acoustic wave is 100%. As a result, essentially only a surface acoustic wave having a longitudinal wave as the main component is reflected.

Also, it is preferred that the longitudinal wave component constitute approximately 70% or more when the energy strength of the entire excited surface acoustic wave is 100%. As a result, only a surface acoustic wave having a longitudinal wave as its main component is reflected, and characteristics deterioration caused by the occurrence of unnecessary modes is prevented. Even more preferred, when the displacements of the excited surface acoustic wave's longitudinal wave component, an SH component and an SV component are $u_1$, $u_2$, and $u_3$ respectively, is that a ratio between the substrate surface displacements $u_1$ and $u_2$ is about 0.015 or less when the substrate surface is electrically open, and/or about 0.1 or less when the substrate surface is electrically short-circuited, which achieves even better characteristics.

According to another preferred embodiment of the present invention, step differences are provided at intermediate height positions of the pair of opposite end surfaces, and reflection end surfaces are defined by end surface portions that are closer to the main surface side where the IDT is provided than the step differences. Also, the dimensions of the reflection end surfaces in the height direction are in the range of about 5λ to about 20λ, where λ is the wavelength of the surface acoustic wave. By doing so, the surface acoustic wave having a longitudinal wave as a main component is efficiently reflected by the reflection end surfaces. Therefore, for example, grooves having a depth in the range of about 5λ and about 20λ are formed in the mother substrate and the substrate is divided at the centers of the grooves to efficiently manufacture a plurality of end surface reflection type surface acoustic wave apparatuses.

The piezoelectric substrate of preferred embodiments of the present invention is not especially limited as long as a surface acoustic wave having a longitudinal wave as its main component can be excited. Examples of this sort of piezoelectric substrate include an $Li_2B_4O_7$ substrate with Euler angles of approximately (0°, 40~60°, 90°) or approximately (90°, 90°, 20~50°), a crystal substrate with Euler angles of approximately (0°, 120~140°, 150°) or approximately (0°, 155.25°, 42°), an $LiNbO_3$ or $LiTaO_3$ substrate with Euler angles of approximately (90°, 90°, 10~90°), or other suitable substrates.

According to another preferred embodiment of the present invention, an end surface reflection type surface acoustic wave apparatus includes a piezoelectric substrate having a pair of opposite main surfaces and a pair of opposite end surfaces that connect the pair of opposite main surfaces, and at least one interdigital transducer disposed on one main surface of the piezoelectric substrate, wherein a shear vertical surface acoustic wave is a main component of surface acoustic waves generated along the piezoelectric substrate.

That is, the present inventors discovered that, among excited surface acoustic waves, a surface acoustic wave having an SV wave as its main component is reliably reflected at the opposing end surfaces of a substrate without causing mode conversion. Therefore, the present inventors discovered that it is possible to make an end surface reflection type surface acoustic wave apparatus that uses a surface acoustic wave that has an SV wave as its main component.

An SV wave has a faster acoustic velocity than an SH wave, so an end surface reflection type surface acoustic wave apparatus in accordance with this preferred embodiment of present invention can also handle high frequencies easily. Also, since it is an end surface reflection type surface acoustic wave apparatus, reflectors are not necessary, so the apparatus can be very compact.

According to another preferred embodiment of the present invention, the SH wave component and the longitudinal wave component, other than the SV wave component, each occupy no more than about 20% when the energy strength of the entire excited surface acoustic wave is 100%. As a result, essentially only a surface acoustic wave that has an SV wave as its main component is reflected.

Also, if the SV wave component occupies approximately 70% or more when the energy strength of the entire excited surface acoustic wave is 100%, only a surface acoustic wave that has an SV wave as its main component is efficiently reflected, and characteristics deterioration caused by the occurrence of unnecessary modes is prevented. Even more preferred, when the displacements of the excited surface acoustic wave's longitudinal wave component, SH component, and SV component are $u_1$, $u_2$, and $u_3$ respectively, is that a ratio $u_2/u_3$ is about 0.015 or less when the substrate surface is electrically open, and/or that $u_2/u_3$ is about 0.1 or less when the substrate surface is electrically short-circuited, thereby resulting in even better characteristics.

According to another preferred embodiment of the present invention, step differences are provided at intermediate height positions of the pair of opposite end surfaces, and reflection end surfaces are provided of end surface portions that are closer to the main surface where the IDT is provided than the step differences. Also, the dimensions of the reflection end surfaces in the height direction are preferably within the range about 5λ to about 20λ, where λ is the wavelength of the surface acoustic wave. By doing so, the surface acoustic wave having an SV wave as its main component is efficiently reflected by the reflection end surfaces. Therefore, for example, grooves having a depth that is in the range of about 5λ to about 20λ are formed in the mother substrate and the substrate is divided at the centers of the grooves to efficiently manufacture a plurality of end surface reflection type surface acoustic wave apparatuses.

The piezoelectric substrate of this preferred embodiment of the present invention is not especially limited as long as a surface acoustic wave having an SV wave as a main component can be excited. An example of this sort of piezoelectric substrate is an $Li_2B_4O_7$ substrate with Euler angles of approximately (0°, 45~80°, 90°).

According to another preferred embodiment of the present invention, the preferred embodiments described above are constituted so that the intersection width W of the interdigital transducer with regard to the product of the electromechanical coupling coefficient k and the number N of pairs of interdigital transducers (total number of pairs of longitudinal-coupling-type resonator filters) satisfies the following relationship:

$$W \geq 2.1 + 30.5 e^{-(x-0.016)/0.055} + 7.1 e^{-(x-0.016)/0.012}$$

where $x = k^2 N$.

According to another preferred embodiment of the present invention, the intersection width W of the interdigital transducer with regard to the product of the relative permittivity $\epsilon_{33}^{S*}$ of the piezoelectric substrate and the number N of pairs of interdigital transducers satisfies the following relationship:

$$W \geq -1.68 + 25.9 e^{-(x-37)/44.8} + 15.6 e^{-(x-37)/216.1}$$

where $x = N\epsilon_{33}^{S*}$.

According to another preferred embodiment of the present invention, an end surface reflection type surface acoustic wave apparatus in accordance with the preferred embodiments described above, is constructed such that an angle formed by the propagation direction of the phase speed of the surface acoustic wave and the end surfaces is approximately 90±5°, and the angle formed by the upper sections of the end surfaces and the front surface of the substrate is approximately 90±10°.

According to another preferred embodiment of the present invention, in an end surface reflection type surface acoustic wave apparatus according to preferred embodiments described above, a wavelength of the surface acoustic wave is λ and there is a single electrode, and the end surface is located at a position that is approximately $\lambda/2 \pm \lambda/10$ toward the outside of the surface acoustic wave propagation direction from the center of the electrode that is inside of the outermost electrode of the interdigital transducer.

In the case of a split electrode defining pairs of electrode fingers with the same charge, the end surface is located at a position that is an integer multiple of approximately $\lambda/2 \pm \lambda/10$ from the center of the electrode fingers forming a pair.

According to another preferred embodiment of the present invention, a communication device includes at least one surface acoustic wave apparatus according to preferred embodiments of the present invention described above.

Other features, elements, characteristics and advantages of the present invention will become apparent from the following detailed description with reference to the attached drawings.

BRIEF DESCRIPTIONS OF THE DRAWINGS

DETAILED DESCRIPTION OF PREFERRED EMBODIMENTS

Below, the present invention shall be explained by explaining specific preferred embodiments of end surface reflection type surface acoustic wave apparatuses in accordance with the present invention while referring to drawings.

Figure 1A:
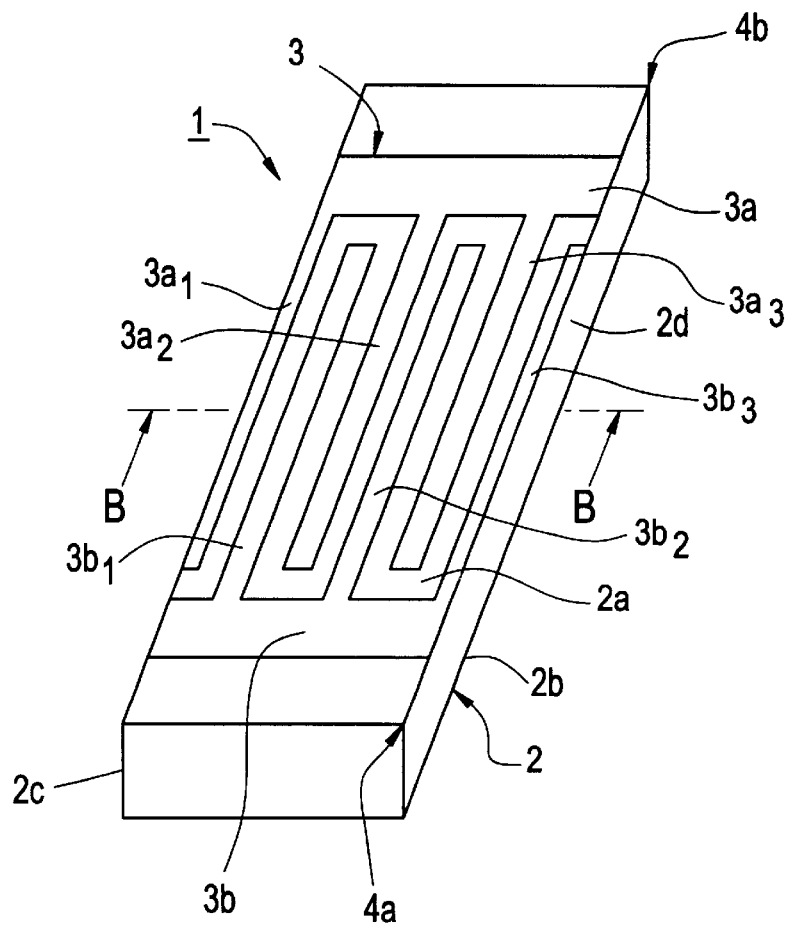
FIG. 1(a) is a perspective view showing an end surface reflection type surface acoustic wave resonator according to a first preferred embodiment of the present invention.
Figure 1B:
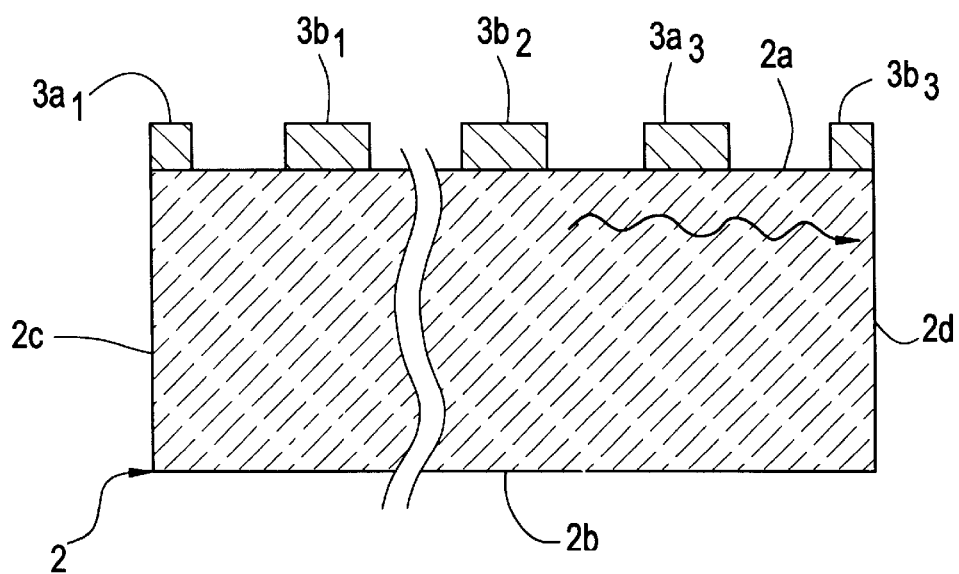
FIG. 1(b) is a sectional view along line B—B in FIG. 1(a).

FIG. 1(a) is a perspective view showing an end surface reflection type surface acoustic wave resonator according to a first preferred embodiment of the present invention. FIG. 1(b) is a sectional view along line B—B in FIG. 1(a).

An end surface reflection type surface acoustic wave resonator 1 includes a piezoelectric substrate 2. The piezoelectric substrate 2 preferably has a substantially rectangular plate shape. In this preferred embodiment, the piezoelectric substrate 2 is preferably made from a piezoelectric material having end surfaces that reflect waves that have a longitudinal wave as its main component, such as $Li_2B_4O_7$ with Euler angles of approximately (0°, 40~60°, 90°). An $Li_2B_4O_7$ substrate with Euler angles of approximately (90°, 90°, 20~50°), a crystal substrate with Euler angles of approximately (0°, 120~140°, 150°) or approximately (0°, 155.25°, 42°), an LiNbO$_3$ or LiTaO$_3$ substrate with Euler angles of approximately (90°, 90°, 10~90°), or other suitable substrates, can also be used as the piezoelectric single crystal constituting the piezoelectric substrate 2.

When a surface acoustic wave is excited in the piezoelectric substrate 2, which includes of these piezoelectric single crystals, as will be described later, a surface acoustic wave having a longitudinal wave as its main component is generated with a sufficient magnitude.

The piezoelectric substrate 2 has a pair of opposite main surfaces 2a and 2b and a pair of opposite end surfaces 2c and 2d. An interdigital transducer (IDT) 3 is provided on the main surface 2a. The IDT 3 has a pair of comb electrodes 3a and 3b. The comb electrodes 3a and 3b have electrode fingers $3a_1$~$3a_3$ and $3b_1$~$3b_3$ respectively. The electrode fingers $3a_1$~$3a_3$ and electrode fingers $3b_1$~$3b_3$ are arranged so as to be inserted into each other.

The electrode fingers $3a_1$~$3a_3$ and $3b_1$~$3b_3$ extend in a direction that is substantially parallel to the end surfaces 2c and 2d. When an input voltage is applied to the IDT 3, surface acoustic waves are excited, and the surface acoustic waves are propagated in a direction that is substantially perpendicular to the direction in which the electrode fingers $3a_1$~$3a_3$ and $3b_1$~$3b_3$ extend and substantially parallel to the main surface 2a. Therefore the surface acoustic waves are propagated in a direction defined by connecting the end surface 2c and the end surface 2d, and are reflected by the end surfaces 2c and 2d.

In the end surface reflection type surface acoustic wave resonator 1 of this preferred embodiment, the piezoelectric substrate 2 is preferably made from the above-described material, so a wave having a longitudinal wave as its main component, that constitutes about 70% of the total energy strength of the entire excited surface acoustic waves. As described above, a Rayleigh wave has two components including a longitudinal wave component and an SV wave component. These two components are always coupled and propagated. Nevertheless, the longitudinal wave component dominates if the above-described specific piezoelectric substrate 2 is used.

The longitudinal wave has a sound velocity that is faster than that of an SH-type surface acoustic wave such as a BGS wave. For example, the sound velocity of an SH wave in an approximately 36° rotated Y plate X propagation LiTaO$_3$ substrate is about 4160 m/second, whereas the sound velocity in X-cut 31° propagation LiTaO$_3$ is about 6300 m/second. Therefore, the end surface reflection type surface acoustic wave resonator 1 can handle frequencies that are about 1.5 times higher than can an end surface reflection type surface acoustic wave resonator utilizing SH-type surface acoustic waves.

Figure 2:
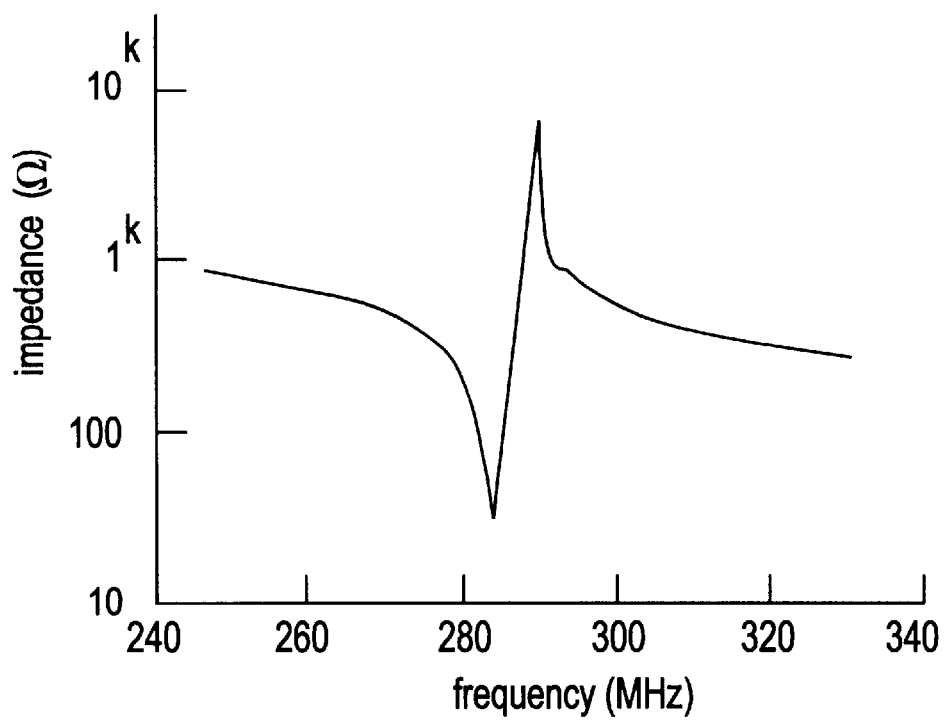
FIG. 2 is a graph showing the frequency characteristics of an end surface reflection type resonator according to the first preferred embodiment of the present invention.

Furthermore, it was previously believed that since the longitudinal wave component and SV component are coupled in a Rayleigh wave, they undergo mode conversion to an SV wave and longitudinal wave respectively when the Rayleigh wave is reflected at the substrate end surface. Nevertheless, in this preferred embodiment's end surface reflection type surface acoustic wave resonator 1, where the main component is a longitudinal wave component, the end surfaces 2c and 2d are disposed so as to be almost perpendicular to the main surface 2a, so the aforesaid conversion—that is, mode conversion—is very unlikely to occur. It is preferred that the end surfaces 2c and 2d are arranged to define an angle within approximately 90±5° relative to the main surface 2a. By doing so, about 97% or more of the longitudinal wave component is reflected without mode conversion. Here, FIG. 2 shows the frequency characteristics of an end surface reflection type resonator. As is clear from FIG. 2, there is little or no deterioration of characteristics due to mode conversion, so the impedance ratio between resonance and antiresonance is about 46 dB. This is explained with reference to FIG. 3.

Figure 3:
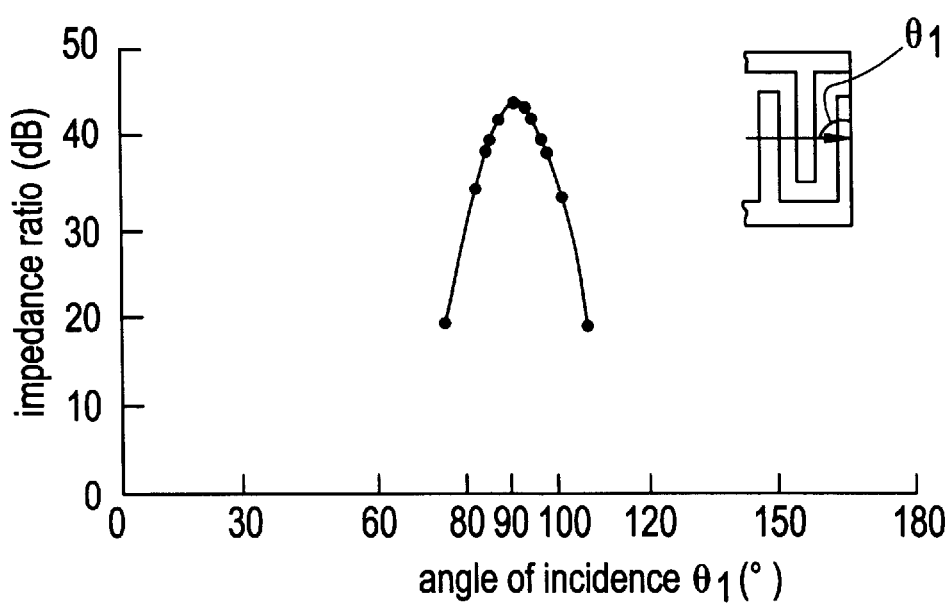
FIG. 3 is a graph showing the effect of the angle formed by the surface acoustic wave propagation direction and a substrate end surface on resonator impedance characteristics.
Figure 4:
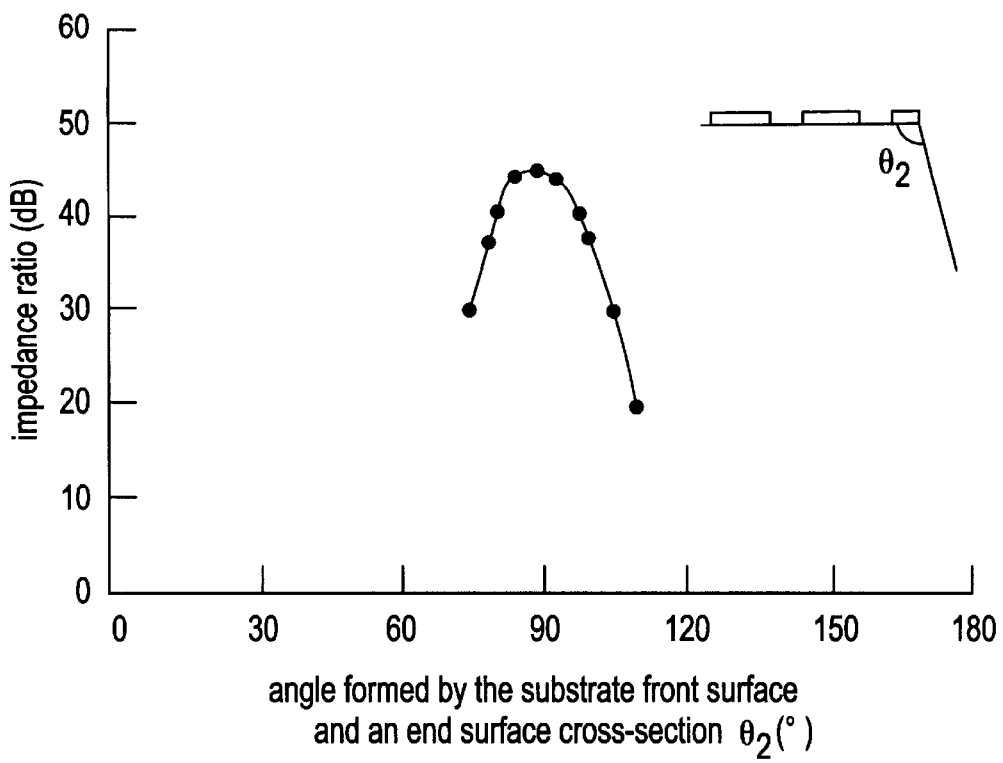
FIG. 4 is a graph showing the effect of the angle formed by the substrate front surface and an end surface cross-section on resonator impedance characteristics.

FIG. 3 is a graph showing the relationship between the impedance ratio of an end surface reflection type resonator and the angle formed by the SAW phase speed propagation direction and end surfaces 4a and 4b (FIG. 1) on the front surface of the substrate. FIG. 4 is a graph showing the relationship between the impedance ratio of the resonator and the angle formed by the front surface of the resonator and the end surface section 2d (see FIG. 1). As is clear from FIG. 3 and FIG. 4, when the angle formed by the end surfaces 4a and 4b and the surface acoustic wave propagation direction is in the range of about 90±5° and the angle formed by the end surface sections 2c and 2d and the surface acoustic wave propagation direction is in the range of about 90±10°, most of the longitudinal wave does not experience mode conversion, and the resonator impedance is at the practical level of about 40 dB or higher. Furthermore, the reason why the resonator impedance ratio is preferably about 40 dB or higher is when a resonator is used in an oscillation circuit, it does not oscillate sufficiently if the ratio is not approximately 40 dB or higher.

Figure 5:
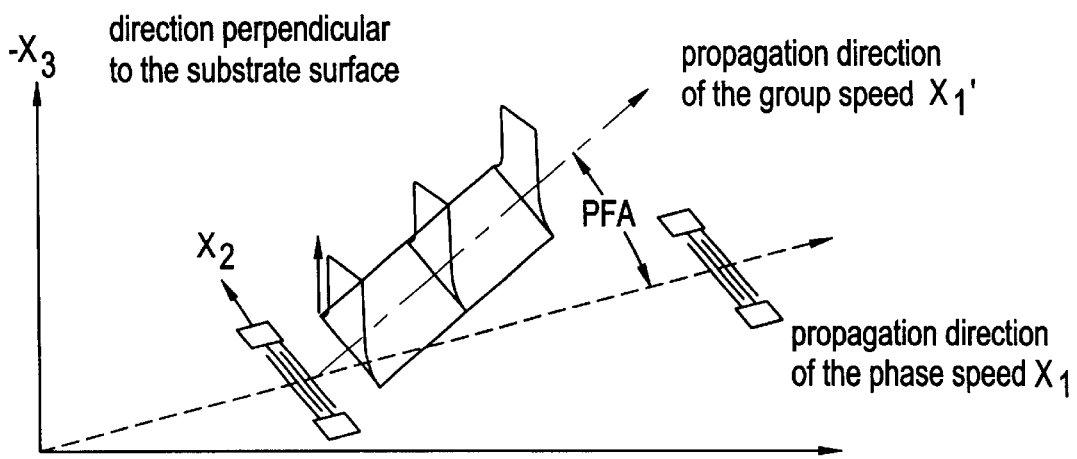
FIG. 5 is a schematic drawing for explaining power flow angle (PFA).
Figure 6:
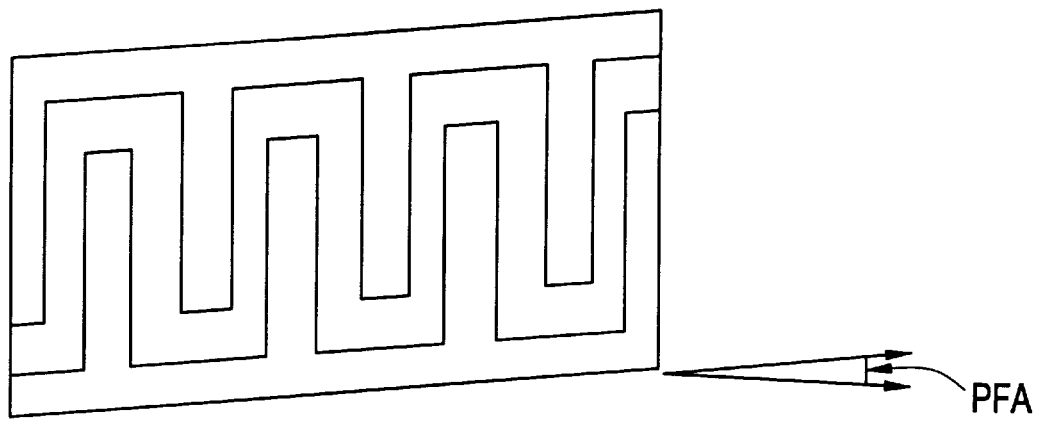
FIG. 6 is a simplified plan view showing the electrode structure when the PFA is not zero.

With reference to FIG. 1 through FIG. 4, we described a case in which the angle formed by a surface acoustic wave's phase speed propagation direction and the group speed propagation direction (power flow angle: PFA) is zero. However, the situation is the same when the PFA is not zero. Direction $x_1$ shown in FIG. 5 is the phase speed propagation direction and $x_1'$ is the group speed propagation direction, and the angle formed between these two directions is the PFA. When PFA is not approximately zero the electrode fingers should be offset and a bus bar arranged so that the bus bar and group speed become substantially parallel, in accordance with the substrate PFA as shown in FIG. 6.

Next, the inventors experimented with using an X-cut LiTaO$_3$ substrate to make longitudinal waves the main component. The inventors with changing the phase speed propagation direction from the Y axis to the Z axis in the range of about 30° to about 60°. The Euler angles were approximately (90°, 90°, 30°~60°). The intersection width was about 20λ and the number of pairs was 50 pairs.

Figure 7:
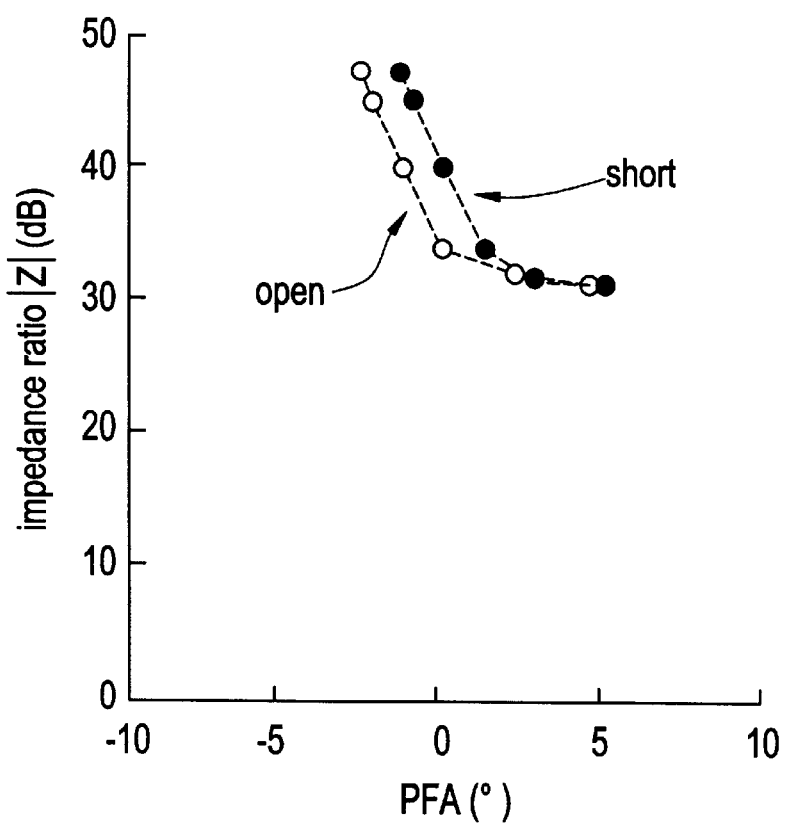
FIG. 7 is a graph showing the relationship between impedance ratio and PFA in a prototype end surface reflection type resonator that uses a surface acoustic wave that has a longitudinal wave as its main component.

FIG. 7 shows the relationship between PFA and resonator impedance ratio. In the graph, black circles and white circles indicate the PFA when the substrate surface is electrically short-circuited and open, respectively. In these devices, PFA generally should be zero, but FIG. 7 shows that PFA does not always have to be zero.

Figure 8:
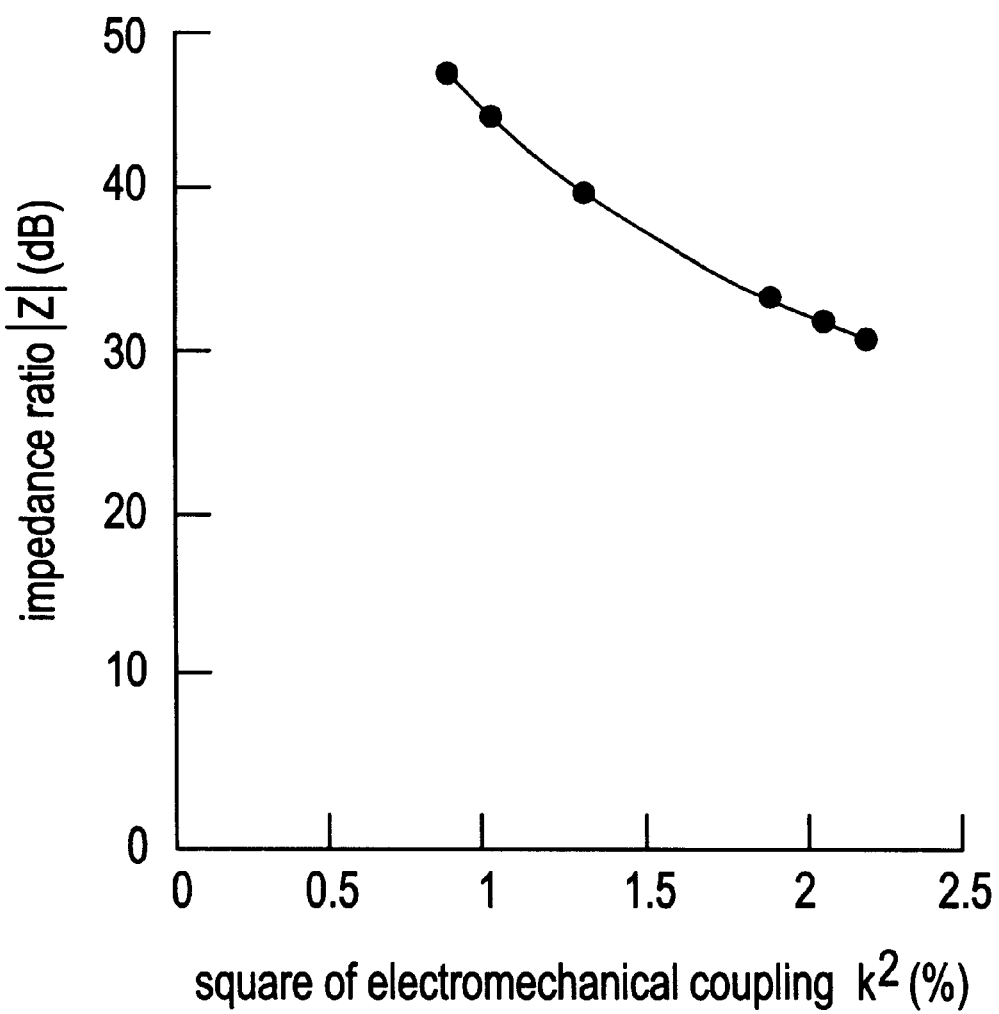
FIG. 8 is a graph showing the relationship between impedance ratio and the square of electromechanical coupling coefficient in a prototype end surface reflection type resonator that uses a surface acoustic wave having a longitudinal wave as its main component.

FIG. 8 shows the relationship between the square of electromechanical coupling coefficient k and impedance ratio. Previously, it was said that a large $k^2$ produced a good impedance ratio in end surface reflection of SH waves, but FIG. 8 shows that that does not apply to a surface acoustic wave having a longitudinal wave as its main component.

Figure 9:
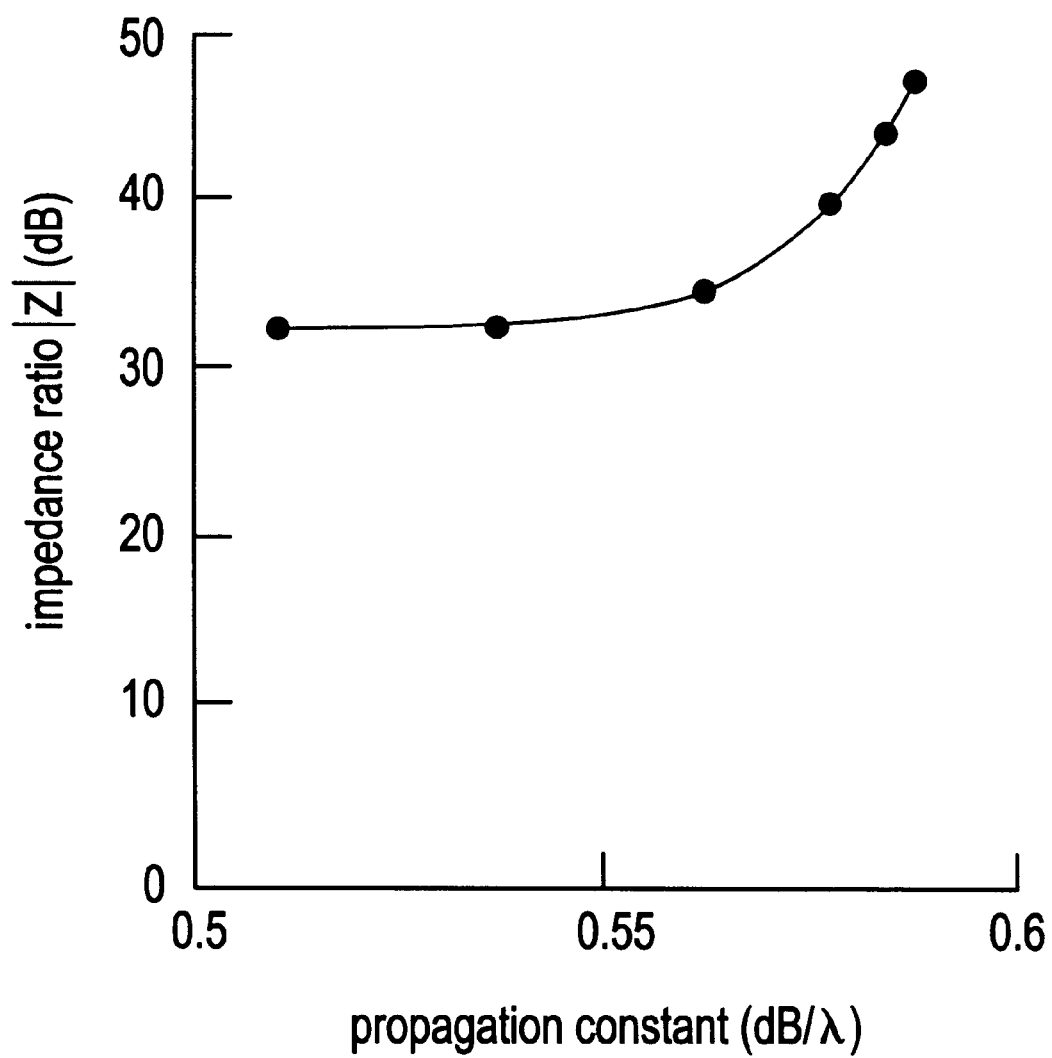
FIG. 9 is a graph showing the relationship between impedance ratio and propagation constant when the substrate surface is electrically short-circuited in a prototype end surface reflection type resonator that uses a surface acoustic wave having a longitudinal wave as its main component.

FIG. 9 shows the relationship between impedance ratio and surface acoustic wave propagation constant (propagation loss). It is common knowledge that in a surface acoustic wave device a smaller propagation constant is better, but from FIG. 9 too it is clear that this does not apply to a surface acoustic wave having a longitudinal wave as its main component.

Figure 10:
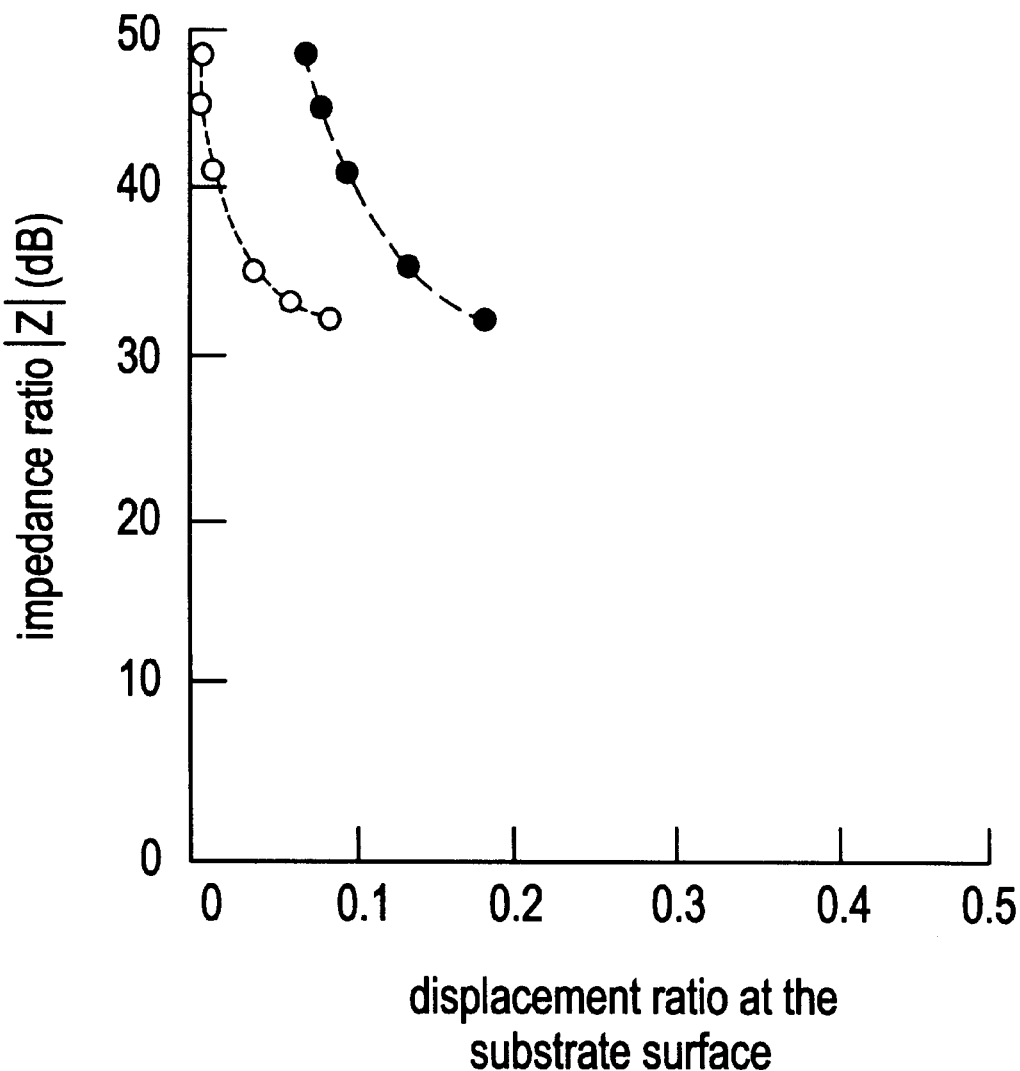
FIG. 10 is a graph showing the relationship between impedance ratio and surface acoustic wave component displacement ratio $u_2/u_1$ at the substrate surface in a prototype end surface reflection type resonator that uses a surface acoustic wave having a longitudinal wave as its main component.

FIG. 10 shows the ratio of three displacement components at the substrate surface. The factors $u_1$, $u_2$, and $u_3$ indicate the displacement of the longitudinal wave component, SH component, and SV component respectively. In the graph, black circles and white circles indicate the displacement ratio $u_2/u_1$ when the substrate surface is electrically short-circuited and open, respectively. As is clear from the graph, the conditions that provide impedance of about 40 dB or higher are approximately 0.1 or less for black circles and approximately 0.015 or less for white circles. In an end surface reflection type surface acoustic wave apparatus that makes longitudinal waves the main component in this manner, it is clear that that characteristic is more strongly dependent on the displacement ratio $u_2/u_1$ than on PFA, $k^2$, or propagation constant.

In principle, the size of the PFA is optional. In practice, when making a surface acoustic wave apparatus, the element becomes inclined if the PFA is large and it becomes awkward to handle. Therefore the PFA should be approximately −15° to approximately 15°.

Furthermore, the size of the displacement can be calculated using the fixed element method (FEM) or the Coyrbeel & Jone method (J. J. Coyrbeel & R. Jone: IEEE trens. Sonic & Ultreson., su-15, 4, p. 209 (October 1968)).

Figure 11A:
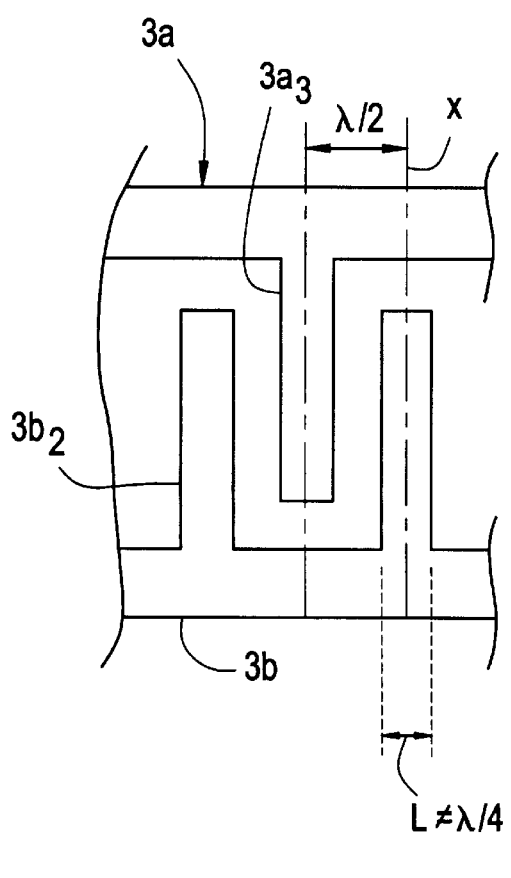
FIG. 11(a) is a schematic plan view for explaining end surface formation position in a surface acoustic wave apparatus including a single electrode in the first preferred embodiment when the electrode finger width is not approximately λ/4.

Furthermore, in the end surface reflection type surface acoustic wave resonator 1 including a single electrode, the widths of the electrode fingers at the outermost side of the surface acoustic wave propagation direction are arranged so as to have a width of about $\lambda/8$ when the wavelength of the surface acoustic wave is $\lambda$, the widths of the remaining electrode fingers $3a_2$, $3a_3$, $3b_1$, and $3b_2$ are preferably about $\lambda/4$, and the width of the gaps between electrode fingers is preferably about $\lambda/4$. For longitudinal waves and SV waves in particular, we discovered that end surface displacement of up to about $\pm\lambda/10$ is a practical level, based on our evaluation of resonator impedance ratio. That is, in obtaining the end surface reflection type surface acoustic wave resonator 1, usually the end surfaces 2c and 2d are formed so that the width of the electrode fingers $3a_1$ and $3b_3$ at the outermost sides is approximately $\lambda/8\pm\lambda/10$. Of course, as shown in FIG. 11(a), when an IDT having electrode fingers that are not approximately $\lambda/4$ is provided on a piezoelectric substrate—for example, when forming electrode fingers that are approximately $3\lambda/10$—the gap becomes about $2\lambda/10$ and the electrode fingers on the outermost sides are about $3\lambda/20$. In this sort of situation, the end surface 2d is formed by cutting the piezoelectric substrate at position X, which is an integer multiple of $\lambda/2\pm\lambda/10$ from the center of the electrode finger $3a_3$ toward the outside of the surface acoustic wave propagation direction. The same is true for the end surface 2c.

Figure 11B:
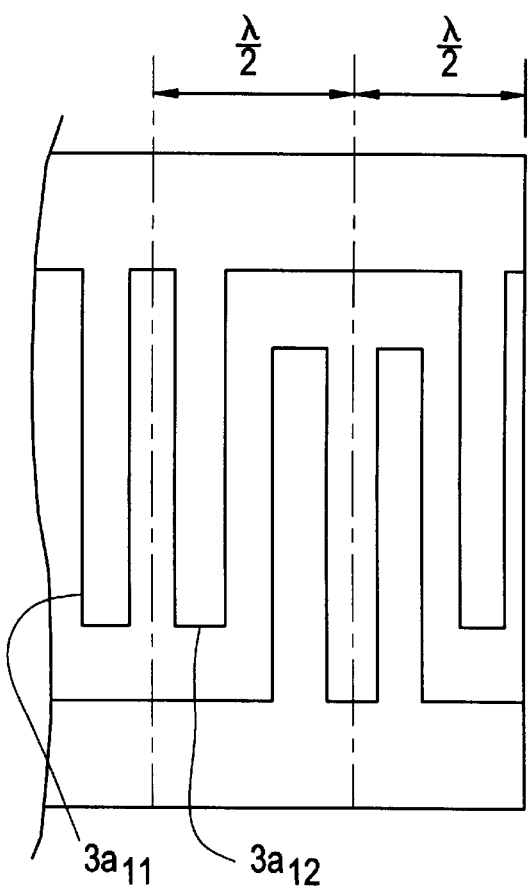
FIG. 11(b) is a schematic plan view for explaining end surface formation position in a surface acoustic wave apparatus using a split electrode in the first preferred embodiment of the present invention.

In the case of split electrode fingers, as shown in FIG. 11(b), the piezoelectric substrate is cut at a position that is an integer multiple of $\lambda/2\pm\lambda/10$ from the center of the electrode fingers $3a_{11}$ and $3a_{12}$ that form a pair.

A second preferred embodiment of the present invention provides an end surface reflection type surface acoustic wave resonator that uses a surface acoustic wave having an SV wave as its main component. Since the structure of the second preferred embodiment is preferably the same as that of the end surface reflection type surface acoustic wave resonator 1 of the first preferred embodiment, a detailed structural explanation shall be omitted by using FIG. 1 and the explanation of the first preferred embodiment.

In the second preferred embodiment, the piezoelectric substrate 2 is preferably made from a substrate material excited by a wave that has an SV wave as its main component when input voltage is applied to the IDT 3. For example, this material may preferably be a (0°, 51°, 90°) $Li_2B_4O_7$ substrate.

Therefore, when input voltage is applied to the IDT 3 in the end surface reflection type surface acoustic wave resonator 1 according to the second preferred embodiment, a surface acoustic wave having an SV wave as its main component propagates between the opposite end surfaces 2c and 2d and is reflected by the end surfaces 2c and 2d.

In the second preferred embodiment too, if the end surfaces 2c and 2d are almost perpendicular to the main surface 2a, close to 100% of the SV wave is reflected and almost none of the waves which were mode-converted to longitudinal waves are reflected. The same results are obtained as in FIG. 3 and FIG. 4 for the relationship between resonator impedance ratio and the angle formed by the propagation direction of a surface acoustic wave that has an SV wave as its main component and the substrate front surface and for the angle formed by the SAW phase speed propagation direction and end surface section. The present inventors discovered that when the angle of incidence relative to the substrate surface end surfaces is in the range of about 90±5° (about 90±10° for the substrate surface and end surface section) almost all of the SV wave is reflected without undergoing mode conversion. Therefore, in the end surface reflection type surface acoustic wave resonator 1, an SV wave can be made to reflect with excellent efficiency without undergoing mode conversion by making the angle formed by the SAW propagation direction and the substrate surface end surfaces in the range of about 90±5° (in the range of about 90±10° for the angle between the substrate surface and end surface section), and it is possible to obtain an end surface reflection type surface acoustic wave resonator that utilizes SV waves.

Also, in order to obtain even better impedance characteristics, the displacement ratio $u_2/u_3$ of the surface acoustic wave component of the substrate surface has the same sort of relationship as for longitudinal-wave-type surface acoustic waves. That is, it is preferred that $u_2/u_3 \leq 0.015$ when the substrate surface is electrically open. It is preferred that $u_2/u_3 \leq 0.10$ when electrically short-circuited. The end surface position in the case of split electrodes follows the same conditions as in the case of a surface acoustic wave having a longitudinal wave component as its main component.

Figure 12:
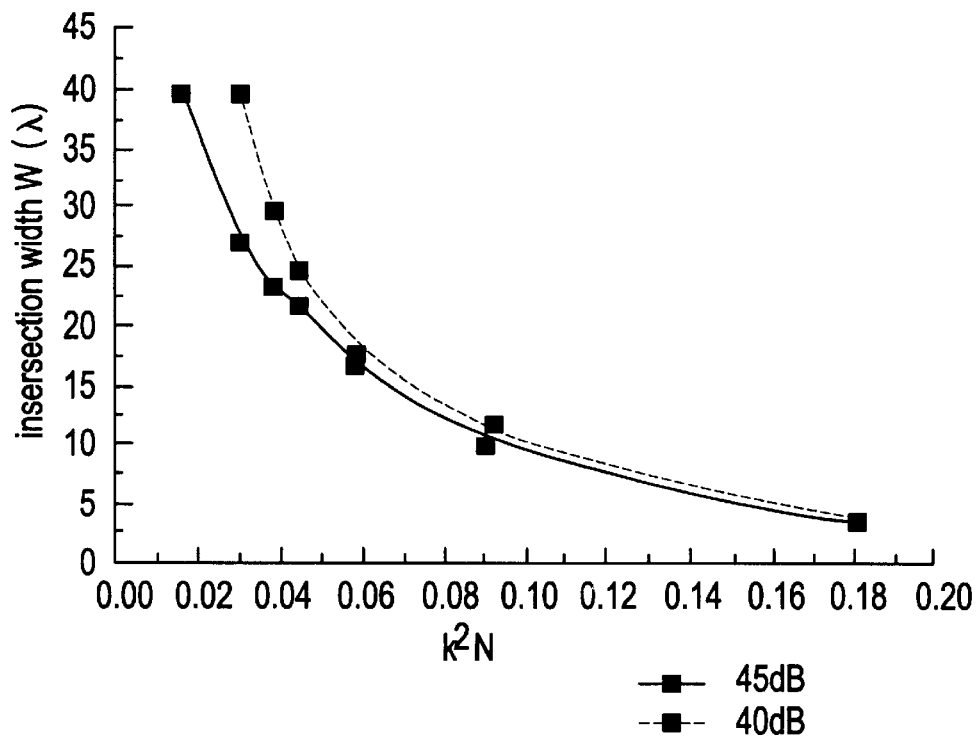
FIG. 12 is a graph showing the relationship between intersection width and $k^2N$ needed to obtain an impedance ratio of about 40 dB or about 45 dB or higher.

The present inventors discovered the relationships between the electromechanical coupling coefficient k and relative permittivity $\epsilon_{33}^{S*}$ of the piezoelectric substrate and IDT intersection width W and number of pairs N. The present inventors produced the resonator that utilized longitudinal-wave end surface reflection shown in FIG. 1, and evaluated the resonance characteristics impedance ratio shown in FIG. 2. FIG. 12 shows the relationship between $k^2N$ and W. The region above the solid line is the region where a resonance characteristics impedance ratio of about 40 dB or higher was obtained, and the region above the broken line is the region where it was about 45 dB or higher. That is, the intersection width should be an intersection width that satisfies the following equation in order to obtain about 40 dB or higher.

$$W \geq 2.1 + 30.5 e^{-(x-0.016)/0.055} + 7.1 e^{-(x-0.016)/0.012}$$

where $x = k^2 N$ and W is a value normalized by $\lambda$.

Also, the intersection width should be an intersection width that satisfies the following equation in order to obtain about 45 dB or higher.

$$W \geq 2.8 + 24.2 e^{-(x-0.03)/0.052} + 12.9 e^{-(x-0.03)/0.011}$$

Figure 13:
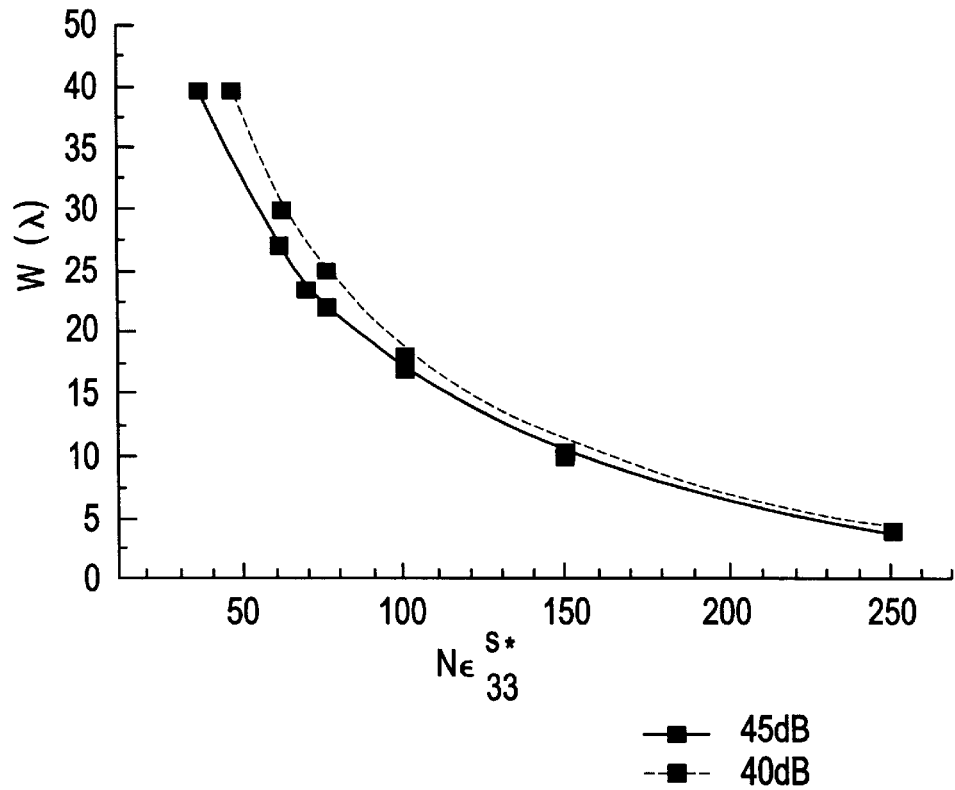
FIG. 13 is a graph showing the relationship between intersection width and $N\epsilon_{33}^{S*}$ needed to obtain an impedance ratio of about 40 dB or about 45 dB or higher.

FIG. 13 shows the relationship between $\epsilon_{33}^{S*} \times N$ and W. The region above the solid line is the region where an impedance ratio of about 40 dB or higher was obtained, and the region above the broken line is the region where it was about 45 dB or higher. That is, the intersection width has the following equation in order to obtain about 40 dB or higher:

$$W \geq -1.68 + 25.9 e^{-(x-37)/44.8} + 15.6 e^{-(x-37)/216}$$

where $x = N \epsilon_{33}^{S*}$.

Also, the intersection width has the following equation in order to obtain an impedance ratio of about 45 dB or higher:

$$W \geq -1.23 + 15.7 e^{-(x-47)/15.7} + 25.4 e^{-(x-47)/128.8}$$

A resonator that used SV waves showed the same characteristics as FIG. 12 and FIG. 13. Since these waves oscillate differently than Rayleigh waves and SH waves, the optimal intersection widths for the SV waves shown above and longitudinal waves differ from those of Rayleigh waves and SH waves.

Furthermore, here the results for resonators are presented, but the optimal intersection widths for resonator-type filters, which will be described later, showed the same results. In the transverse-mode type, it corresponds to the IDT intersection width and number of pairs respectively, and in the longitudinal-mode type, it corresponds to the total number of IDT pairs (for one line) between both end surfaces.

The first and second preferred embodiments of the present invention were explained with reference to the example of the end surface reflection type surface acoustic wave resonator 1 in which the end surfaces 2c and 2d are reflection end surfaces. However, in an end surface reflection type surface acoustic wave apparatus in accordance with preferred embodiments of the present invention, only the upper portions of two opposite end surfaces may function as reflection end surfaces.

Figure 14:
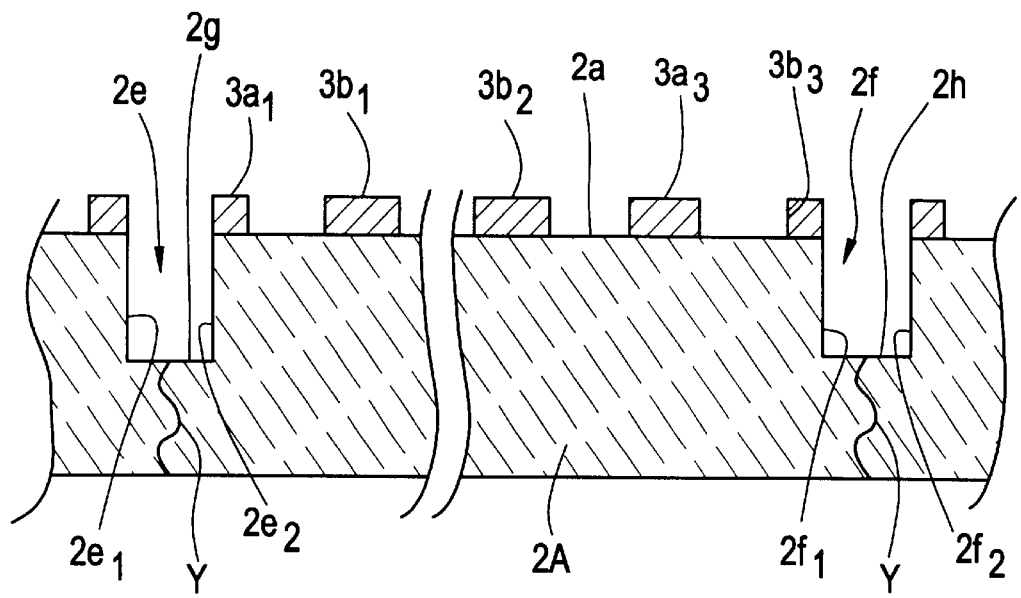
FIG. 14 is a sectional view for explaining the groove formation position and cutting position for obtaining individual end surface reflection type surface acoustic wave resonators when the end surface reflection type surface acoustic wave resonator of the first preferred embodiment is manufactured from a mother substrate.

That is, as shown in FIG. 14's partially omitted sectional view, a plurality of IDTs 3 constituting a plurality of end surface reflection type surface acoustic wave resonators is formed on a mother piezoelectric substrate 2A, and then grooves 2e and 2f are formed. The grooves 2e and 2f can be formed, for example, by a dicer or other suitable tool, and have mutually parallel side surfaces $2e_1$, and $2e_2$ and $2f_1$ and $2f_2$ respectively. Also, the positions for forming the side surfaces $2e_2$ and $2f_1$ at the IDT 3 side of the grooves 2e and 2f are the same positions as the end surfaces 2c and 2d in the first and second preferred embodiments described previously. That is, the side surfaces $2e_2$ and $2f_1$ constitute reflection end surfaces.

After the grooves 2e and 2f are formed, the piezoelectric substrate 2A is divided as shown by breaking lines Y at the bottoms of the grooves 2e and 2f. In this way, the present modification's end surface reflection type surface acoustic wave resonator is obtained. Now, step differences 2g and 2h are formed at the bottoms of the grooves 2e and 2f at the two opposite end surfaces. That is, step differences 2g and 2h are formed at intermediate height positions of the two opposite end surfaces, and the side surfaces $2e_2$ and $2f_1$, which are end surface portions closer to the main surface 2a side than the step differences 2g and 2h, constitute reflection end surfaces.

In this modification's end surface reflection type surface acoustic wave resonator, it is preferred that the height-direction dimensions of the side surfaces $2e_2$ and $2f_1$ are within the range of about $5\lambda$ to about $20\lambda$ when the wavelength of the longitudinal wave or SV wave used is $\lambda$. That is, the energy of longitudinal waves and SV waves concentrates in a range that is about $5\lambda$ to about $20\lambda$ in depth from the main surface 2a side where the IDT 3 is formed, so a longitudinal wave or SV wave is efficiently reflected when the height-direction dimensions of the side surfaces $2e_2$ and $2f_1$, which constitute the reflection end surfaces, are in the specified range, as in the present modification.

Also, in the modification it is preferred that the side surfaces $2e_2$ and $2f_1$, which constitute the reflection end surfaces, be arranged so as to define an angle of about $90 \pm 10°$ relative to the main surface.

We have explained an example of an end surface reflection type surface acoustic wave resonator 1, but the present invention is not limited to an end surface reflection type surface acoustic wave resonator. The present invention can also be applied to various types of surface acoustic wave apparatuses, such as end surface reflection type filters having a plurality of IDTs provided on a piezoelectric substrate and ladder-type filters including a plurality of coupled resonators.

Figure 15:
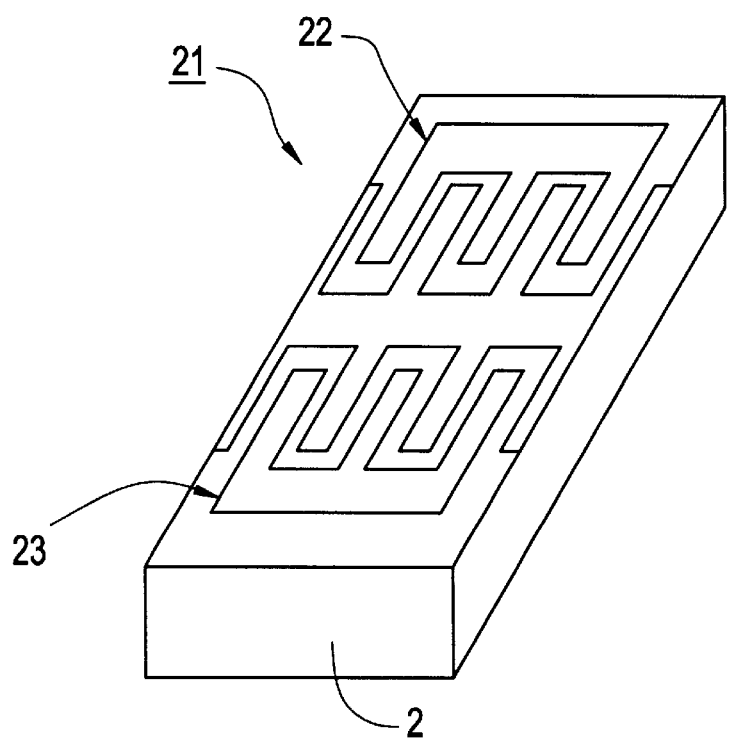
FIG. 15 is a perspective view showing a transversely coupled type end surface reflection type surface acoustic wave filter as another example of an end surface reflection type surface acoustic wave apparatus according to preferred embodiments of the present invention.

For example, in the transversely-coupled type end surface reflection type surface acoustic wave filter 21 shown in FIG. 15, IDTs 22 and 23 are aligned on the piezoelectric substrate 2 in a direction that is substantially perpendicular to a surface acoustic wave propagation direction.

Figure 16:
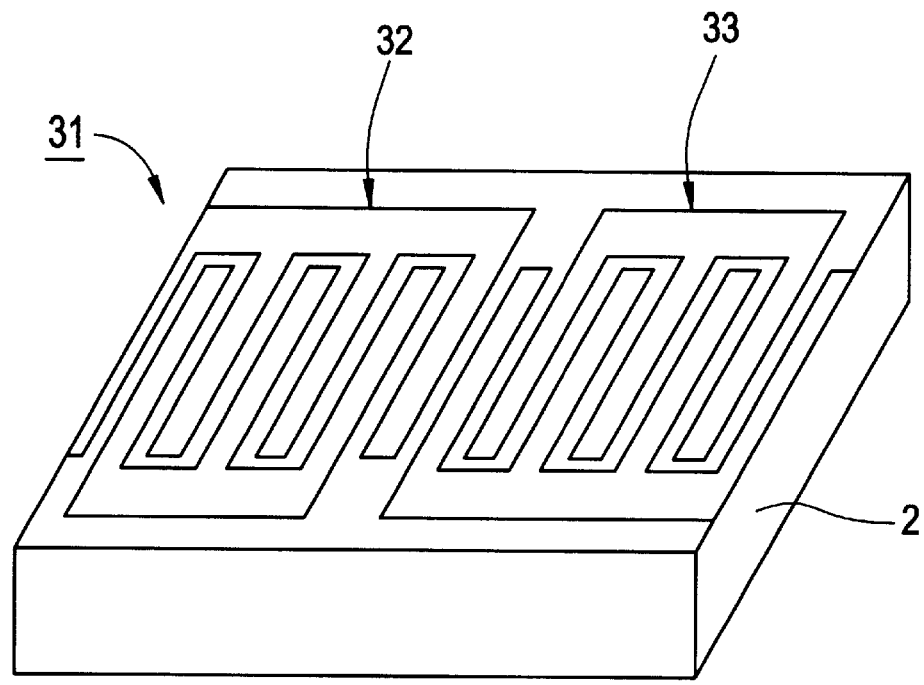
FIG. 16 is a perspective view showing a longitudinally coupled end surface reflection type surface acoustic wave filter as another example of an end surface reflection type surface acoustic wave apparatus according to preferred embodiments of the present invention.

Also, in the longitudinally-coupled type end surface reflection type surface acoustic wave filter 31 shown in FIG. 16, two IDTs 32 and 33 are arranged on the piezoelectric substrate 2. The IDTs 32 and 33 are disposed substantially parallel along a surface acoustic wave propagation direction.

The drawing shows two IDTs, but more than two IDTs may be disposed in parallel along a surface acoustic wave propagation direction, with the same effect being obtained.

Figure 17:
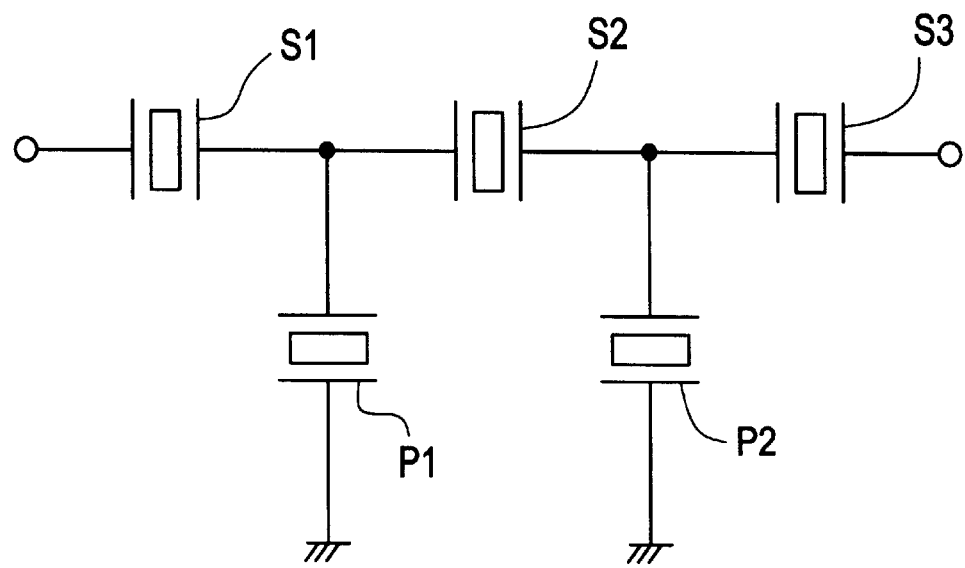
FIG. 17 is a drawing showing the circuit structure of a ladder filter.

In addition, as shown in FIG. 17, a structure may be configured in which a plurality of IDTs is arranged on a piezoelectric substrate so as to constitute a ladder-type circuit having a plurality of series resonators S1~S3 and a plurality of parallel resonators P1 and P2, and each resonator function as an end surface reflection type surface acoustic wave resonator.

In these end surface reflection type surface acoustic wave filters, it is possible to provide an end surface reflection type surface acoustic wave filter having longitudinal waves or SV waves as its main component, by using the above-described specific piezoelectric substrate as the piezoelectric substrate and making the angle formed by the piezoelectric substrate's main surface and end surface in the range of about 90±5°.

Figure 18:
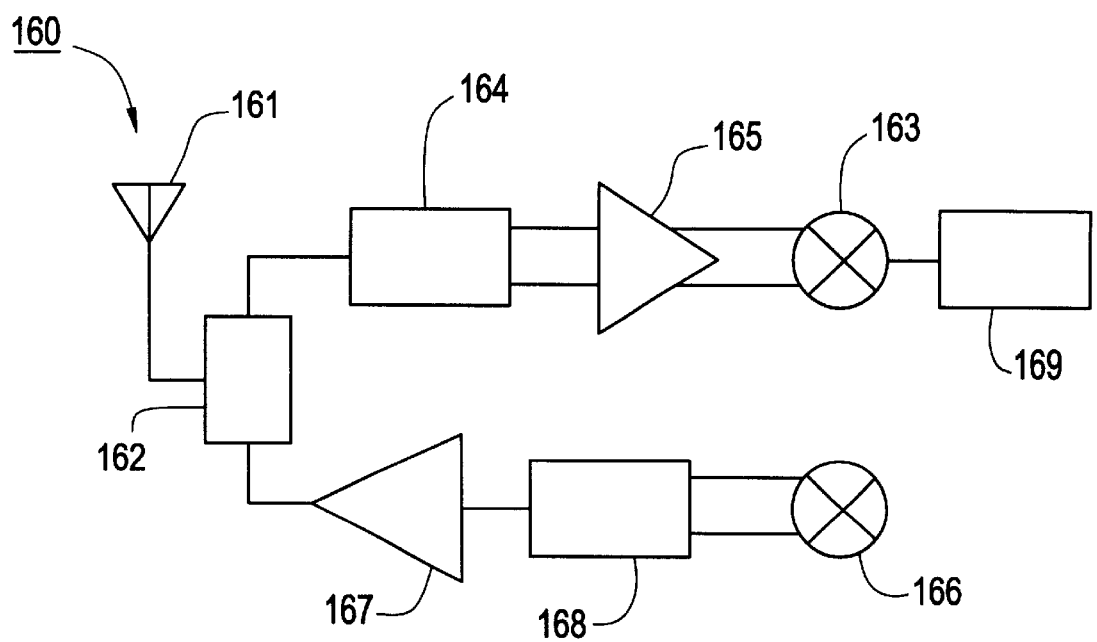
FIG. 18 is a schematic block diagram for explaining a communication device using a surface acoustic wave apparatus in accordance with preferred embodiments of the present invention.

FIG. 18 is a schematic block diagram for explaining a communication device 160 using a surface acoustic wave apparatus in accordance with various preferred embodiments of the present invention.

In FIG. 18, a duplexer 162 is connected to an antenna 161. A surface acoustic wave filter 164 and an amplifier 165, which constitute an RF stage, are connected between the duplexer 162 and a receiving-side mixer 163. In addition, an IF-stage surface acoustic wave filter 169 is connected to the mixer 163. Also, an amplifier 167 and a surface acoustic wave filter 168, which constitute an RF stage, are connected between the duplexer 162 and a transmitting-side mixer 166.

An end surface reflection type surface acoustic wave filter according to various preferred embodiments of the present invention can be successfully used as the IF-stage surface acoustic wave filter 169 in the communication device 160.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. An end surface reflection type surface acoustic wave apparatus comprising:
   a piezoelectric substrate having a pair of opposite main surfaces and a pair of opposite end surfaces that connect the pair of opposite main surfaces; and
   at least one interdigital transducer disposed on one main surface of said piezoelectric substrate; wherein
   surface acoustic waves that are excited along the piezoelectric substrate have a longitudinal wave as the main component thereof.

2. An end surface reflection type surface acoustic wave apparatus according to claim 1, wherein a shear horizontal wave component and a shear vertical wave component, other than the longitudinal wave component, each constitutes no more than about 20% of the entire amount of energy strength of the excited surface acoustic waves.

3. An end surface reflection type surface acoustic wave apparatus according to claim 1, wherein said longitudinal wave component constitutes about 70% or more of the entire energy strength of the excited surface acoustic waves.

4. An end surface reflection type surface acoustic wave apparatus according to claim 1, wherein when the displacements of the excited surface acoustic wave's longitudinal wave component, shear horizontal component, and shear vertical component are $u_1$, $u_2$, and $u_3$ respectively, the substrate surface's displacement ratio $u_2/u_1$ is about 0.015 or less when the substrate surface is electrically open.

5. An end surface reflection type surface acoustic wave apparatus according to claim 1, wherein when the displacements of the excited surface acoustic wave's longitudinal wave component, shear horizontal component, and shear vertical component are $u_1$, $u_2$, and $u_3$ respectively, the substrate surface's displacement ratio $u_2/u_1$ is about 0.1 or less when the substrate surface is electrically short-circuited.

6. An end surface reflection type surface acoustic wave apparatus according to claim 1, wherein step differences are located at intermediate height positions of said pair of opposite end surfaces, and reflection end surfaces are located at end surface portions disposed closer to the main surface side where said interdigital transducer is provided than the step differences, and the dimensions of the reflection end surfaces in the height direction are in the range of about $5\lambda$ to about $20\lambda$, where $\lambda$ is the wavelength of the surface acoustic wave.

7. An end surface reflection type surface acoustic wave apparatus according to claim 1, wherein said piezoelectric substrate is one of an $Li_2B_4O_7$ substrate having Euler angles of approximately (0°, 40~60°, 90°) or approximately (90°, 90°, 20~50°), a crystal substrate having Euler angles of approximately (0°, 120~140°, 150°) or approximately (0°, 155.25°, 42°), and an $LiNbO_3$ or $LiTaO_3$ substrate having Euler angles of approximately (90°, 90°, 10~90°).

8. An end surface reflection type surface acoustic wave apparatus according to claim 1, wherein an intersection width W of the interdigital transducer with regard to the product of the electromechanical coupling coefficient k and the number N of pairs of interdigital transducers (total number of pairs of longitudinal-coupling-type resonator filters) satisfies the following relationship:

$$W \geq 2.1 + 30.5 e^{-(x-0.016)/0.055} + 7.1 e^{-(x-0.016)/0.012}$$

where $x = k^2 N$.

9. An end surface reflection type surface acoustic wave apparatus according to claim 1, wherein an intersection width W of the interdigital transducer with regard to the product of the relative permittivity $\epsilon_{33}^{S*}$ of the piezoelectric substrate and the number N of pairs of interdigital transducers (total number of pairs of longitudinal-coupling-type resonator filters) satisfies the following relationship:

$$W \geq -1.68 + 25.9 e^{-(x-37)/448} + 15.6 e^{-(x-37)/216.1}$$

where $x = N \epsilon_{33}^{S*}$.

10. An end surface reflection type surface acoustic wave apparatus according to claim 1, wherein an angle formed by a propagation direction of the phase speed of the surface acoustic wave and said end surfaces is about 90±5°, and an angle formed by upper sections of the end surfaces and the front surface of the substrate is about 90±10°.

11. An end surface reflection type surface acoustic wave apparatus according to claim 1, wherein when the wavelength of the surface acoustic wave is $\lambda$, said end surface is located at a position that is about $\lambda/2 + \lambda/10$ toward the outside of the surface acoustic wave propagation direction from the center of the electrode that is inside of the outermost electrode of the interdigital transducer.

12. A communication device apparatus comprising at least one end surface reflection type surface acoustic wave apparatus according to claim 1.

13. An end surface reflection type surface acoustic wave apparatus comprising:
   a piezoelectric substrate having a pair of opposite main surfaces and a pair of opposite end surfaces that connect the pair of opposite main surfaces; and
   at least one interdigital transducer disposed on one main surface of said piezoelectric substrate; wherein
   surface acoustic waves that are excited along the piezoelectric substrate have a shear vertical wave as the main component thereof.

14. An end surface reflection type surface acoustic wave apparatus according to claim 13, wherein a shear horizontal wave component and a longitudinal wave component, other than the shear vertical wave component, each constitute no more than about 20% of the total energy strength of the excited surface acoustic waves.

15. An end surface reflection type surface acoustic wave apparatus according to claim 13, wherein said shear vertical wave component constitutes about 70% or more of the total energy strength of the excited surface acoustic waves.

16. An end surface reflection type surface acoustic wave apparatus according to claim 13, wherein when the displacements of the excited surface acoustic wave's longitudinal wave component, shear horizontal component, and shear vertical component are $u_1$, $u_2$, and $u_3$ respectively, the substrate surface's displacement ratio $u_2/u_3$ is about 0.015 or less when the substrate surface is electrically open.

17. An end surface reflection type surface acoustic wave apparatus according to claim 13, wherein when the displacements of the excited surface acoustic wave's longitudinal wave component, shear horizontal component, and shear vertical component are $u_1$, $u_2$, and $u_3$ respectively, the substrate surface's displacement ratio $u_2/u_3$ is about 0.1 or less when the substrate surface is electrically short-circuited.

18. An end surface reflection type surface acoustic wave apparatus according to claim 13, wherein step differences are located at intermediate height positions of said pair of opposite end surfaces, and reflection end surfaces are defined by end surface portions that are closer to the main surface side where said interdigital transducer is located than the step differences, and the dimensions of said reflection end surfaces in the height direction are in the range of about $5\lambda$ to about $20\lambda$, where $\lambda$ is the wavelength of the surface acoustic wave.

19. An end surface reflection type surface acoustic wave apparatus according to claim 13, wherein said piezoelectric substrate is an $Li_2B_4O_7$ substrate having Euler angles of approximately (0°, 45~80°, 90°).

20. An end surface reflection type surface acoustic wave apparatus according to claim 13, wherein an intersection width W of the interdigital transducer with regard to the product of the electromechanical coupling coefficient k and the number N of pairs of interdigital transducers (total number of pairs of longitudinal-coupling-type resonator filters) satisfies the following relationship:

$$W \geq 2.1 + 30.5e^{-(x-0.016)/0.055} + 7.1e^{-(x-0.016)/0.012}$$

where $x = k^2 N$.

21. An end surface reflection type surface acoustic wave apparatus according to claim 13, wherein an intersection width W of the interdigital transducer with regard to the product of the relative permittivity $\epsilon_{33}^{S*}$ of the piezoelectric substrate and the number N of pairs of interdigital transducers (total number of pairs of longitudinal-coupling-type resonator filters) satisfies the following relationship:

$$W \geq -1.68 + 25.9e^{-(x-37)/44.8} + 1.5.6e^{-(x-37)/216.1}$$

where $x = N\epsilon_{33}^{S*}$.

22. An end surface reflection type surface acoustic wave apparatus according to claim 13, wherein when the wavelength of the surface acoustic wave is $\lambda$, said end surface is located at a position that is about $\lambda/2 + \lambda/10$ toward the outside of the surface acoustic wave propagation direction from the center of the electrode that is inside of the outermost electrode of the interdigital transducer.

23. An end surface reflection type surface acoustic wave apparatus according to claim 13, wherein an angle formed by a propagation direction of the phase speed of the surface acoustic wave and said end surfaces is about 90±5°, and an angle formed by upper sections of the end surfaces and the front surface of the substrate is about 90±10°.

24. A communication device apparatus comprising at least one end surface reflection type surface acoustic wave apparatus according to claim 13.

* * * * *